United States Patent
Ackelid (10) Patent No.: US 9,550,207 B2
(45) Date of Patent: Jan. 24, 2017

(54) METHOD AND APPARATUS FOR ADDITIVE MANUFACTURING

(71) Applicant: ARCAM AB, Moelndal (SE)

(72) Inventor: Ulf Ackelid, Goeteborg (SE)

(73) Assignee: Arcam AB, Moelndal (SE)

( * ) Notice: Subject to any disclaimer, the term of this patent is extended or adjusted under 35 U.S.C. 154(b) by 108 days.

(21) Appl. No.: 14/230,922

(22) Filed: Mar. 31, 2014

(65) Prior Publication Data

US 2014/0314964 A1 Oct. 23, 2014

Related U.S. Application Data

(60) Provisional application No. 61/813,555, filed on Apr. 18, 2013.

(51) Int. Cl.
| | |
|---|---|
| *B05D 3/06* | (2006.01) |
| *B22F 1/02* | (2006.01) |
| *B22F 3/105* | (2006.01) |
| *B28B 1/00* | (2006.01) |
| *B29C 67/00* | (2006.01) |

(Continued)

(52) U.S. Cl.
CPC ............. *B05D 3/068* (2013.01); *B22F 1/025* (2013.01); *B22F 3/1055* (2013.01); *B28B 1/001* (2013.01); *B29C 67/0077* (2013.01); *C23C 14/00* (2013.01); *C23C 14/223* (2013.01); *C23C 16/4417* (2013.01); *B22F 2003/1056* (2013.01); *B22F 2998/10* (2013.01); *B22F 2999/00* (2013.01); *Y02P 10/295* (2015.11)

(58) Field of Classification Search
CPC .... C23C 14/223; C23C 16/4417; B05D 3/068
See application file for complete search history.

(56) References Cited

U.S. PATENT DOCUMENTS

| | | | |
|---|---|---|---|
| 2,264,968 A | 12/1941 | De Forest | |
| 2,323,715 A | 7/1943 | Kuehni | |

(Continued)

FOREIGN PATENT DOCUMENTS

| | | |
|---|---|---|
| CA | 2860188 A1 | 6/2006 |
| CN | 101607311 A | 12/2009 |

(Continued)

OTHER PUBLICATIONS

International Searching Authority, International Search Report for International Application No. PCT/EP2012/058733, Mar. 5, 2013, 4 pages, European Patent Office, The Netherlands.

(Continued)

*Primary Examiner* — Xiao Zhao
(74) *Attorney, Agent, or Firm* — Alston & Bird LLP (57) ABSTRACT

Various embodiments provide a method and apparatus for forming a three-dimensional article through successive fusion of parts of at least one layer of a powder bed provided on a work table in an additive manufacturing machine, which parts corresponds to successive cross sections of the three-dimensional article. The method comprises the steps of: applying a layer of predetermined thickness of powder particles on the work table, applying a coating on at least a portion of the powder particles, which coating is at least partially covering the powder particles, and fusing the powder particles on the work table with an electron beam.

11 Claims, 4 Drawing Sheets

(51) Int. Cl.
*C23C 14/22* (2006.01)
*C23C 16/44* (2006.01)
*C23C 14/00* (2006.01)

(56) References Cited

U.S. PATENT DOCUMENTS

| | | |
|---|---|---|
| 3,882,477 A | 5/1975 | Mueller |
| 4,348,576 A | 9/1982 | Anderl et al. |
| 4,401,719 A | 8/1983 | Kobayashi et al. |
| 4,818,562 A | 4/1989 | Arcella et al. |
| 4,863,538 A | 9/1989 | Deckard |
| 4,927,992 A | 5/1990 | Whitlow et al. |
| 4,988,844 A | 1/1991 | Dietrich et al. |
| 5,167,989 A * | 12/1992 | Dudek ............ B05D 1/00 118/57 |
| 5,182,170 A | 1/1993 | Marcus et al. |
| 5,204,055 A | 4/1993 | Sachs et al. |
| 5,247,560 A | 9/1993 | Hosokawa et al. |
| 5,393,482 A | 2/1995 | Benda et al. |
| 5,483,036 A | 1/1996 | Giedt et al. |
| 5,511,103 A | 4/1996 | Hasegawa |
| 5,647,931 A | 7/1997 | Retallick et al. |
| 5,753,274 A | 5/1998 | Wilkening et al. |
| 5,837,960 A | 11/1998 | Lewis et al. |
| 5,876,550 A | 3/1999 | Feygin et al. |
| 5,904,890 A | 5/1999 | Lohner et al. |
| 5,932,290 A | 8/1999 | Lombardi et al. |
| 6,046,426 A | 4/2000 | Jeantette et al. |
| 6,162,378 A | 12/2000 | Bedal et al. |
| 6,419,203 B1 | 7/2002 | Dang |
| 6,554,600 B1 | 4/2003 | Hofmann et al. |
| 6,583,379 B1 | 6/2003 | Meiners et al. |
| 6,746,506 B2 | 6/2004 | Liu et al. |
| 6,751,516 B1 | 6/2004 | Richardson |
| 6,764,636 B1 | 7/2004 | Allanic et al. |
| 6,811,744 B2 | 11/2004 | Keicher et al. |
| 6,815,636 B2 | 11/2004 | Chung et al. |
| 6,824,714 B1 | 11/2004 | Türck et al. |
| 7,003,864 B2 | 2/2006 | Dirscherl |
| 7,020,539 B1 | 3/2006 | Kovacevic et al. |
| 7,165,498 B2 | 1/2007 | Mackrill et al. |
| 7,204,684 B2 | 4/2007 | Ederer et al. |
| 7,291,002 B2 | 11/2007 | Russell et al. |
| 7,540,738 B2 | 6/2009 | Larsson et al. |
| 7,635,825 B2 | 12/2009 | Larsson |
| 7,686,605 B2 | 3/2010 | Perret et al. |
| 7,696,501 B2 | 4/2010 | Jones |
| 7,713,454 B2 | 5/2010 | Larsson |
| 7,754,135 B2 | 7/2010 | Abe et al. |
| 7,799,253 B2 | 9/2010 | Höchsmann et al. |
| 7,871,551 B2 | 1/2011 | Wallgren et al. |
| 8,021,138 B2 | 9/2011 | Green |
| 8,083,513 B2 | 12/2011 | Montero-Escuder et al. |
| 8,187,521 B2 | 5/2012 | Larsson et al. |
| 8,308,466 B2 | 11/2012 | Ackelid et al. |
| 8,992,816 B2 | 3/2015 | Jonasson et al. |
| 9,073,265 B2 | 7/2015 | Snis |
| 9,079,248 B2 | 7/2015 | Ackelid |
| 9,126,167 B2 | 9/2015 | Ljungblad |
| 9,310,188 B2 | 4/2016 | Snis |
| 2002/0104973 A1 | 8/2002 | Kerekes |
| 2002/0152002 A1 | 10/2002 | Lindemann et al. |
| 2003/0133822 A1 | 7/2003 | Harryson |
| 2004/0084814 A1 | 5/2004 | Boyd et al. |
| 2004/0104499 A1 | 6/2004 | Keller |
| 2004/0173496 A1 | 9/2004 | Srinivasan |
| 2004/0173946 A1 | 9/2004 | Pfeifer et al. |
| 2005/0173380 A1 | 8/2005 | Carbone |
| 2005/0186538 A1 | 8/2005 | Uckelmann |
| 2006/0108712 A1 | 5/2006 | Mattes |
| 2006/0145381 A1* | 7/2006 | Larsson ............ B29C 67/0077 264/40.6 |
| 2006/0147332 A1 | 7/2006 | Jones et al. |
| 2006/0157892 A1 | 7/2006 | Larsson |
| 2006/0180957 A1 | 8/2006 | Hopkinson et al. |
| 2006/0284088 A1 | 12/2006 | Fukunaga et al. |
| 2007/0175875 A1 | 8/2007 | Uckelmann et al. |
| 2007/0182289 A1 | 8/2007 | Kigawa et al. |
| 2007/0298182 A1 | 12/2007 | Perret et al. |
| 2008/0236738 A1* | 10/2008 | Lo ............ C23C 14/3407 156/283 |
| 2009/0017219 A1 | 1/2009 | Paasche et al. |
| 2009/0152771 A1 | 6/2009 | Philippi et al. |
| 2010/0260410 A1 | 10/2010 | Taminger et al. |
| 2010/0310404 A1 | 12/2010 | Ackelid |
| 2011/0133367 A1 | 6/2011 | Weidinger et al. |
| 2011/0293770 A1 | 12/2011 | Ackelid et al. |
| 2011/0309554 A1 | 12/2011 | Liska et al. |
| 2011/0316178 A1 | 12/2011 | Uckelmann |
| 2012/0100031 A1 | 4/2012 | Ljungblad |
| 2012/0164322 A1 | 6/2012 | Teulet et al. |
| 2012/0193530 A1 | 8/2012 | Parker et al. |
| 2012/0223059 A1 | 9/2012 | Ackelid |
| 2012/0225210 A1 | 9/2012 | Fruth |
| 2012/0266815 A1 | 10/2012 | Brunermer |
| 2013/0055568 A1 | 3/2013 | Dusel et al. |
| 2013/0300286 A1 | 11/2013 | Ljungblad et al. |
| 2013/0343947 A1 | 12/2013 | Satzger et al. |
| 2014/0301884 A1 | 10/2014 | Hellestam et al. |
| 2014/0308153 A1 | 10/2014 | Ljungblad |
| 2014/0314609 A1 | 10/2014 | Ljungblad et al. |
| 2014/0348691 A1 | 11/2014 | Ljungblad et al. |
| 2014/0363327 A1 | 12/2014 | Holcomb |
| 2014/0367367 A1 | 12/2014 | Wood et al. |
| 2015/0004045 A1 | 1/2015 | Ljungblad |
| 2015/0071809 A1 | 3/2015 | Nordkvist et al. |
| 2015/0086409 A1 | 3/2015 | Hellestam |
| 2015/0088295 A1 | 3/2015 | Hellestam |
| 2015/0139849 A1 | 5/2015 | Pialot, Jr. et al. |
| 2015/0151490 A1 | 6/2015 | Jonasson et al. |
| 2015/0165524 A1 | 6/2015 | Ljungblad et al. |
| 2015/0165525 A1 | 6/2015 | Jonasson |
| 2015/0174658 A1 | 6/2015 | Ljungblad |
| 2015/0174695 A1 | 6/2015 | Elfstroem et al. |
| 2015/0251249 A1 | 9/2015 | Fager |
| 2015/0283610 A1 | 10/2015 | Ljungblad et al. |
| 2015/0283613 A1 | 10/2015 | Backlund et al. |
| 2015/0290710 A1 | 10/2015 | Ackelid |
| 2015/0306819 A1 | 10/2015 | Ljungblad |
| 2016/0052056 A1 | 2/2016 | Fager |
| 2016/0052079 A1 | 2/2016 | Ackelid |
| 2016/0054115 A1 | 2/2016 | Snis |
| 2016/0054121 A1 | 2/2016 | Snis |
| 2016/0054347 A1 | 2/2016 | Snis |
| 2016/0059314 A1 | 3/2016 | Ljungblad et al. |
| 2016/0129501 A1 | 5/2016 | Loewgren et al. |
| 2016/0167160 A1 | 6/2016 | Hellestam |
| 2016/0167303 A1 | 6/2016 | Petelet |
| 2016/0202042 A1 | 7/2016 | Snis |
| 2016/0202043 A1 | 7/2016 | Snis |
| 2016/0211116 A1 | 7/2016 | Lock |
| 2016/0279735 A1 | 9/2016 | Hellestam |
| 2016/0282848 A1 | 9/2016 | Hellestam |
| 2016/0303687 A1 | 10/2016 | Ljungblad |
| 2016/0307731 A1 | 10/2016 | Lock |
| 2016/0311021 A1 | 10/2016 | Elfstroem et al. |

FOREIGN PATENT DOCUMENTS

| | | |
|---|---|---|
| CN | 101635210 A | 1/2010 |
| CN | 201693176 U | 1/2011 |
| CN | 101607311 B | 9/2011 |
| DE | 19952998 A1 | 5/2001 |
| DE | 20305843 U1 | 7/2003 |
| DE | 102005014483 A1 | 10/2006 |
| DE | 202008005417 U1 | 8/2008 |
| DE | 102007018601 A1 | 10/2008 |
| DE | 102007029052 A1 | 1/2009 |
| DE | 102008012064 A1 | 9/2009 |
| DE | 102011105045 B3 | 6/2012 |
| EP | 0289116 A1 | 11/1988 |
| EP | 0322257 A2 | 6/1989 |
| EP | 0688262 A1 | 12/1995 |
| EP | 1418013 A1 | 5/2004 |

(56) References Cited

FOREIGN PATENT DOCUMENTS

| | | |
|---|---|---|
| EP | 1466718 A2 | 10/2004 |
| EP | 1683593 A2 | 7/2006 |
| EP | 1721725 A1 | 11/2006 |
| EP | 1752240 A1 | 2/2007 |
| EP | 1952932 A2 | 8/2008 |
| EP | 2011631 A1 | 1/2009 |
| EP | 2119530 A1 | 11/2009 |
| EP | 2281677 A1 | 2/2011 |
| FR | 2980380 A1 | 3/2013 |
| JP | 2003245981 | 9/2003 |
| SE | 524467 C2 | 8/2004 |
| WO | WO 93/08928 | 5/1993 |
| WO | WO 96/12607 A1 | 5/1996 |
| WO | WO 97/37523 A2 | 10/1997 |
| WO | WO 01/81031 A1 | 11/2001 |
| WO | WO 01/85386 A2 | 11/2001 |
| WO | WO 02/08653 A1 | 1/2002 |
| WO | WO 2004/007124 A1 | 1/2004 |
| WO | WO 2004/043680 A2 | 5/2004 |
| WO | WO 2004/054743 A1 | 7/2004 |
| WO | WO 2004/056511 A1 | 7/2004 |
| WO | WO 2006/091097 A2 | 8/2006 |
| WO | WO 2006/121374 A1 | 11/2006 |
| WO | WO 2007/112808 A1 | 10/2007 |
| WO | WO 2007/147221 A1 | 12/2007 |
| WO | WO 2008/013483 A1 | 1/2008 |
| WO | WO 2008/057844 A1 | 5/2008 |
| WO | WO 2008/125497 A1 | 10/2008 |
| WO | WO 2008/147306 A1 | 12/2008 |
| WO | WO 2009/000360 A1 | 12/2008 |
| WO | WO 2009/072935 A1 | 6/2009 |
| WO | WO 2009/084991 A1 | 7/2009 |
| WO | WO 2010/095987 A1 | 8/2010 |
| WO | WO 2011/008143 A1 | 1/2011 |
| WO | WO 2011/030017 A1 | 3/2011 |
| WO | WO 2011/060312 A2 | 5/2011 |
| WO | WO 2012/102655 A1 | 8/2012 |
| WO | WO 2013/098050 A1 | 7/2013 |
| WO | WO 2013/098135 A1 | 7/2013 |
| WO | WO 2013/159811 A1 | 10/2013 |
| WO | WO 2013/167194 A1 | 11/2013 |
| WO | WO 2013/178825 A2 | 12/2013 |
| WO | WO 2014/071968 A1 | 5/2014 |
| WO | WO 2014/095200 A1 | 6/2014 |
| WO | WO 2014/095208 A1 | 6/2014 |

OTHER PUBLICATIONS

Cheah, Chi-Mun, et al., "Automatic Algorithm for Generating Complex Polyhedral Scaffold Structure for Tissue Engineering", Tissue Engineering, 2004, pp. 595-610, vol. 10, No. 3/4, XP002691483.

Guibas, Leonidas J., et al., "Randomized Incremental Construction of Delaunay and Voronoi Diagrams", Algorithmica, Jun. 1992, pp. 381-413, vol. 7, Issue 1-6, Springer-Verlag, New York.

Weigel, Th., et al., "Design and Preparation of Polymeric Scaffolds for Tissue Engineering," Expert Rev. Med. Devices, 2006, pp. 835-851, vol. 3, No. 6, XP002691485.

Yang, et al., "The Design of Scaffolds for Use in Tissue Engineering, Part II, Rapid Prototyping Techniques", Tissue Engineering, 2002, pp. 1-11, vol. 8, No. 1, XP002691484.

International Preliminary Examining Authority, International Preliminary Report on Patentability for International Application No. PCT/EP2012/074383, including Applicant's Sep. 6, 2013 Reply to ISA's Feb. 27, 2013 Written Opinion, mailed Jan. 20, 2014, 16 pages, European Patent Office, The Netherlands.

International Searching Authority, International Search Report and Written Opinion for International Application No. PCT/EP2012/074383, mailed Feb. 27, 2013, 10 pages, European Patent Office, The Netherlands.

International Searching Authority, International Search Report for International Application No. PCT/EP2012/057470, mailed Jan. 24, 2013, 1 page, European Patent Office, The Netherlands.

* cited by examiner

METHOD AND APPARATUS FOR ADDITIVE MANUFACTURING

CROSS-REFERENCE TO RELATED APPLICATIONS

This application claims priority to and the benefit of U.S. Provisional Patent Application Ser. No. 61/813,555, filed Apr. 18, 2013, the contents of which are hereby incorporated by reference in their entirety.

BACKGROUND

Technical Field

The present invention relates to a method and an apparatus for additive manufacturing.

Description of Related Art

Freeform fabrication or additive manufacturing is a method for forming three-dimensional articles through successive fusion of chosen parts of powder layers applied to a worktable.

An additive manufacturing apparatus may comprise a work table on which the three-dimensional article is to be formed, a powder dispenser, arranged to lay down a thin layer of powder on the work table for the formation of a powder bed, an energy beam for delivering energy to the powder whereby fusion of the powder takes place, elements for control of the energy given off by the energy beam over the powder bed for the formation of a cross section of the three-dimensional article through fusion of parts of the powder bed, and a controlling computer, in which information is stored concerning consecutive cross sections of the three-dimensional article. A three-dimensional article is formed through consecutive fusions of consecutively formed cross sections of powder layers, successively laid down by the powder dispenser.

In additive manufacturing it is important to control the powder distribution. It is desirable to distribute a predefined amount of powder over a predetermined area. When fusing the powder at selected locations according to a 3-dimensional model with an electron beam the powder may start to "smoke", i.e., the electron beam may charge the powder particles, which in turn may start to repel each other and lift from the powder bed. Such "smoke" of powder is highly undesirable because, if it happens, the additive manufacturing process is most likely to be stopped. In order to prohibit powder "smoke" there are different methods used such as preheating of the powder layer to be fused and/or reduced power of the fusing beam. These methods may increase the build time which may be a problem.

BRIEF SUMMARY

An object of the various embodiments of the present invention is to provide a method and apparatus which may eliminate or at least reduce the above mentioned problem in the additive manufacturing process. The abovementioned object is achieved by the features in the method and apparatus claimed herein.

Various embodiments provide a method for forming a three-dimensional article through successive fusion of parts of at least one layer of a powder bed provided on a work table in a vacuum chamber, which parts corresponds to successive cross sections of the three-dimensional article. The method comprising the steps of providing a layer of predetermined thickness of powder particles on the work table in the vacuum chamber, providing a coating on at least a portion of the powder particles while the powder is inside the vacuum chamber, which coating is at least partially covering the powder particles, and fusing the powder particles on the work table with an energy beam.

A non-limiting and exemplary advantage of various embodiments of the present invention is that the powder is coated in the vacuum chamber, i.e., the coating is performed under vacuum conditions, which means that the coated powder may be free of surface oxides. In an example embodiment the vacuum condition means a pressure which is less than $1 \times 10^{-2}$ mbar. In another example embodiment the vacuum condition means a pressure which is less than $1 \times 10^{-3}$ mbar. Creating a coated powder without surface oxides means that the electrical conductivity of the powder is much higher compared to a pre coated powder which always has a thin layer of surface oxides and/or surface nitrides. Powder without surface oxides may be sintered at a lower temperature and faster compared to a powder which has surface oxides and/or surface nitrides. The increased conductivity of the powder also means that the probability of powder smoke may be greatly reduced.

In still other exemplary embodiments the coating is provided prior to providing the powder particles on the work table. The coating may for instance be provided on the top surface of the powder in the powder container which may be provided inside the vacuum chamber. The advantage of providing the coating prior to providing the powder on the work table where the three-dimensional article is to be manufactured in that coated and uncoated powder may be mixed during powder distribution on the powder table, which further may improve the electrical conductivity of the powder layer.

In yet still another example embodiment the coating is provided on the powder particles while the powder particles are provided on the work table. The powder in the powder container may be unsuitable for coating the powder to be distributed over the work table. In such cases the coating of the powder may be performed while the powder is already distributed over the worktable just before the fusion of the powder is to be performed. In another example embodiment the powder may first be coated while being in the powder container and thereafter recoated while being provided on the work table. In an example embodiment the coating while being in the powder container may be of a first material and the coating while being on the work table may be of a second material. The first and second material may be the same or different materials with higher electrical conductivity than the clean powder itself.

In still a further example embodiment of the present invention the work table may be vibrating while coating the powder on the work table. The advantage of vibrating the work table may be two fold, firstly the particles may rotate which means that a surface which is not visible for the coating device may be coated, secondly the particles may group together more homogenously, i.e., with less voids, thereby creating a better overall electrical conductivity and packing degree of the powder layer.

In still another example embodiment of the present invention the coating is provided by at least one of the group of: sputtering, chemical vapor deposition, physical vapor deposition, laser ablation, resistive melting of a target, laser beam melting of a target and/or electron beam melting of a target. In an example embodiment the coating is made of the same material as the powder particles. The advantage of providing a coating of the same material as the powder particles is that the material characteristics are not changed.

In still another example embodiment of the present invention the coating is made of another material compared to the powder particles. This may be advantageous if one wants to tweak the material properties with a doping material. In an example embodiment the material properties may be changed for specific layers of the three dimensional article, for instance the outer layer. One may choose a doping material which may amend the ductility of the surface of the three dimensional article.

In still another example embodiment the coating has at least one material component in common with the powder particles. If the powder material is TiAl, the coating may be made of Al, Ti, or TiAl.

In still another example embodiment of the present invention the coating has none material component in common with the powder particles. Small amount of some material may change the microstructure of the fused powder layer.

In still another example embodiment the coating material may have an electrical conductivity which may be higher than the powder particles for increasing the electrical conductivity of the powder. This may be advantageous if the clean powder without coating is having a low conductivity which may not allow fusing with an electron beam which requires an electrically conductive powder. Such powder may for instance be a ceramic or polymer powder. The coating is in such cases made of a material with a low electric resistance.

In another aspect of the present invention it is provided an apparatus for forming a three-dimensional article through successive fusion of parts of at least one layer of a powder bed provided on a work table, which parts corresponds to successive cross sections of the three-dimensional article, the apparatus comprising: an energy beam source for fusing the powder, a powder distributor for distributing the powder on top of the work table, and a coating device for coating at least a portion of the powder with a coating material. In an example embodiment the work table and the coating device are provided in a vacuum chamber. In an example embodiment the work table may be provided with a vibrator which may be activated when coating the powder on the work table.

BRIEF DESCRIPTION OF SEVERAL VIEWS OF THE DRAWINGS

Various embodiments of the invention will be further described in the following, in a non-limiting way with reference to the accompanying drawings. Same characters of reference are employed to indicate corresponding similar parts throughout the several figures of the drawings.

DETAILED DESCRIPTION OF VARIOUS EMBODIMENTS

To facilitate the understanding of various embodiments of the present invention, a number of terms are defined below.

Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

The term "three-dimensional structures" and the like as used herein refer generally to intended or actually fabricated three-dimensional configurations (e.g. of structural material or materials) that are intended to be used for a particular purpose. Such structures, etc. may, for example, be designed with the aid of a three-dimensional CAD system.

The term "electron beam" as used herein in various embodiments refers to any charged particle beam. The sources of charged particle beam can include an electron gun, a linear accelerator and so on. Instead of using an electron beam a laser beam may be used for fusing the powder layers.

Figure 1A:
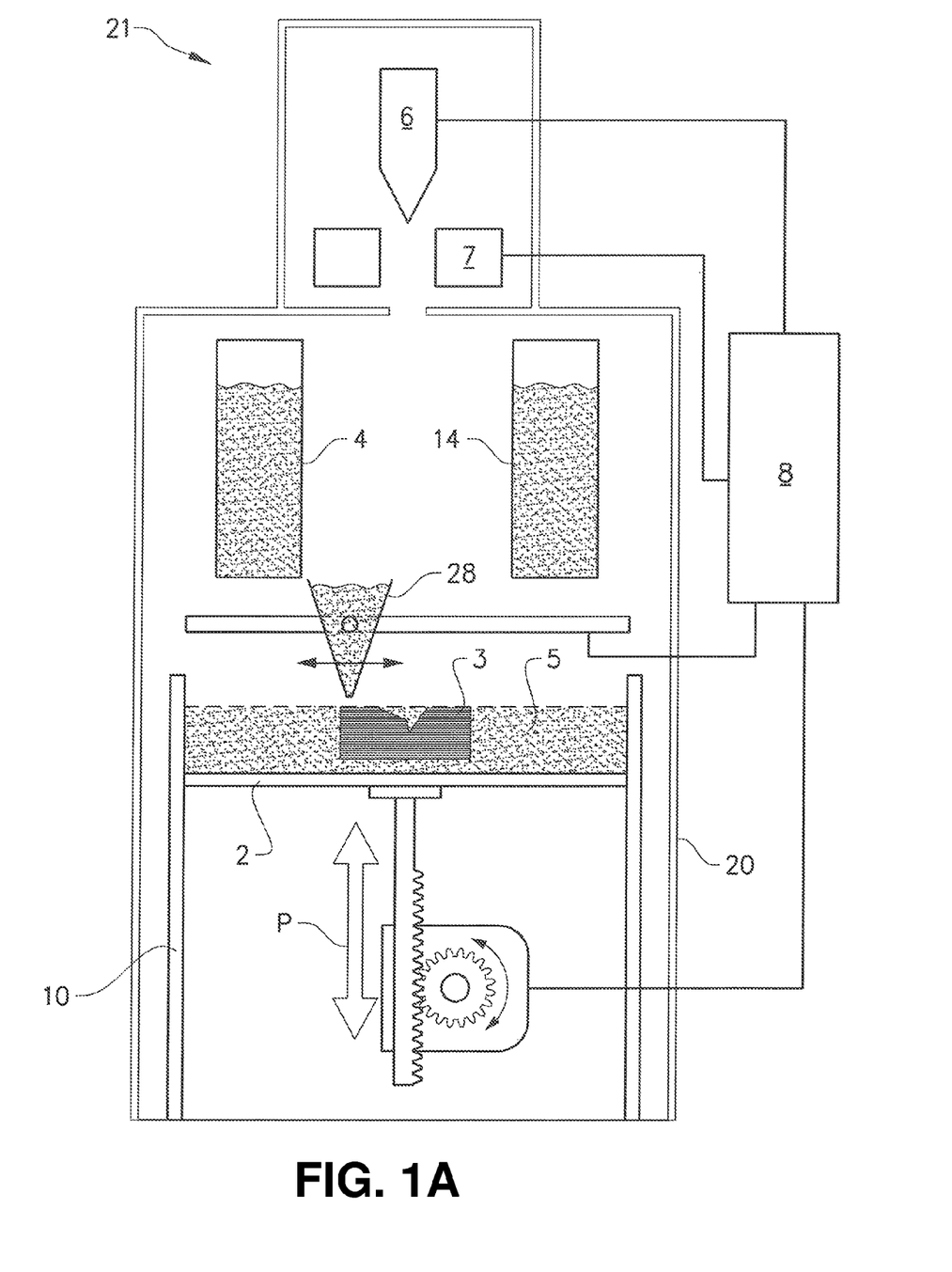
FIG. 1A shows, in a schematic view, an apparatus for producing a three dimensional product according to prior art.

FIG. 1A depicts an embodiment of a freeform fabrication or additive manufacturing apparatus 21 according to prior art. The apparatus 21 comprising an electron beam gun 6; deflection coils 7; two powder hoppers 4, 14; a build platform 2; a build tank 10; a powder distributor 28; a powder bed 5; and a vacuum chamber 20.

The vacuum chamber 20 is configured to maintain a vacuum environment by means of a vacuum system, which system may comprise a turbomolecular pump, a scroll pump, an ion pump and one or more valves which are well known to a skilled person in the art and therefore need no further explanation in this context. The vacuum system is controlled by a control unit 8.

The electron beam gun 6 is generating an electron beam which is used for melting or fusing together powder material provided on the build platform 2. At least a portion of the electron beam gun 6 may be provided in the vacuum chamber 20. The control unit 8 may be used for controlling and managing the electron beam emitted from the electron beam gun 6. At least one focusing coil (not shown), at least one deflection coil 7, an optional coil for astigmatic correction (not shown) and an electron beam power supply (not shown) may be electrically connected to the control unit 8. In an example embodiment of the invention the electron beam gun 6 generates a focusable electron beam with an accelerating voltage which may be about 15-60 kV and with a beam power which may be in the range of 3-10 Kw. The pressure in the vacuum chamber may be $1 \times 10^{-3}$ mbar or lower when building the three-dimensional article by fusing the powder layer by layer with the energy beam.

In certain embodiments a laser beam may be used for melting or fusing the powder material. In such case tiltable mirrors may be used in the beam path in order to deflect the laser beam to a predetermined position.

The powder hoppers 4, 14 comprise the powder material to be provided on the build platform 2 in the build tank 10. The powder material may for instance be pure metals or metal alloys such as titanium, titanium alloys, aluminum, aluminum alloys, stainless steel, Co—Cr alloys, nickel based superalloys, and the like.

The powder distributor 28 is arranged to lay down a thin layer of the powder material on the build platform 2. During a work cycle the build platform 2 will be lowered successively in relation to a fixed point in the vacuum chamber. In order to make this movement possible, the build platform 2 is in one embodiment of the invention arranged movably in vertical direction, i.e., in the direction indicated by arrow P.

This means that the build platform 2 starts in an initial position, in which a first powder material layer of necessary thickness has been laid down. Means for lowering the build platform 2 may for instance be through a servo engine equipped with a gear, adjusting screws, and the like.

An electron beam may be directed over the build platform 2 causing the first powder layer to fuse in selected locations to form a first cross section of the three-dimensional article. The beam is directed over the build platform 2 from instructions given by the control unit 8. In the control unit 8 instructions for how to control the electron beam for each layer of the three-dimensional article is stored.

After a first layer is finished, i.e., the fusion of powder material for making a first layer of the three-dimensional article, a second powder layer is provided on the build platform 2. The second powder layer is typically distributed according to the same manner as the previous layer. However, there might be alternative and/or additional methods in the same additive manufacturing machine for distributing powder onto the work table.

After having distributed the second powder layer on the build platform, the energy beam is directed over the work table causing the second powder layer to fuse in selected locations to form a second cross section of the three-dimensional article. Fused portions in the second layer may be bonded to fused portions of the first layer. The fused portions in the first and second layer may be melted together by melting not only the powder in the uppermost layer but also remelting at least a fraction of a thickness of a layer directly below the uppermost layer.

A first example embodiment of a method according to the present invention comprises at least the step of forming a three-dimensional article 110 through successive fusion of parts of at least one layer of a powder bed provided on a work table 102 in an additive manufacturing machine 100, which parts corresponds to successive cross sections of the three-dimensional article. The exemplary embodiment may further comprise the steps of providing a layer of predetermined thickness of powder particles on the work table 102, providing a coating 122 on at least a portion of the powder particles which coating is at least partially covering the powder particles, and fusing the powder particles on the work table with an electron beam 155, as may be understood from FIG. 1B.

Figure 1B:
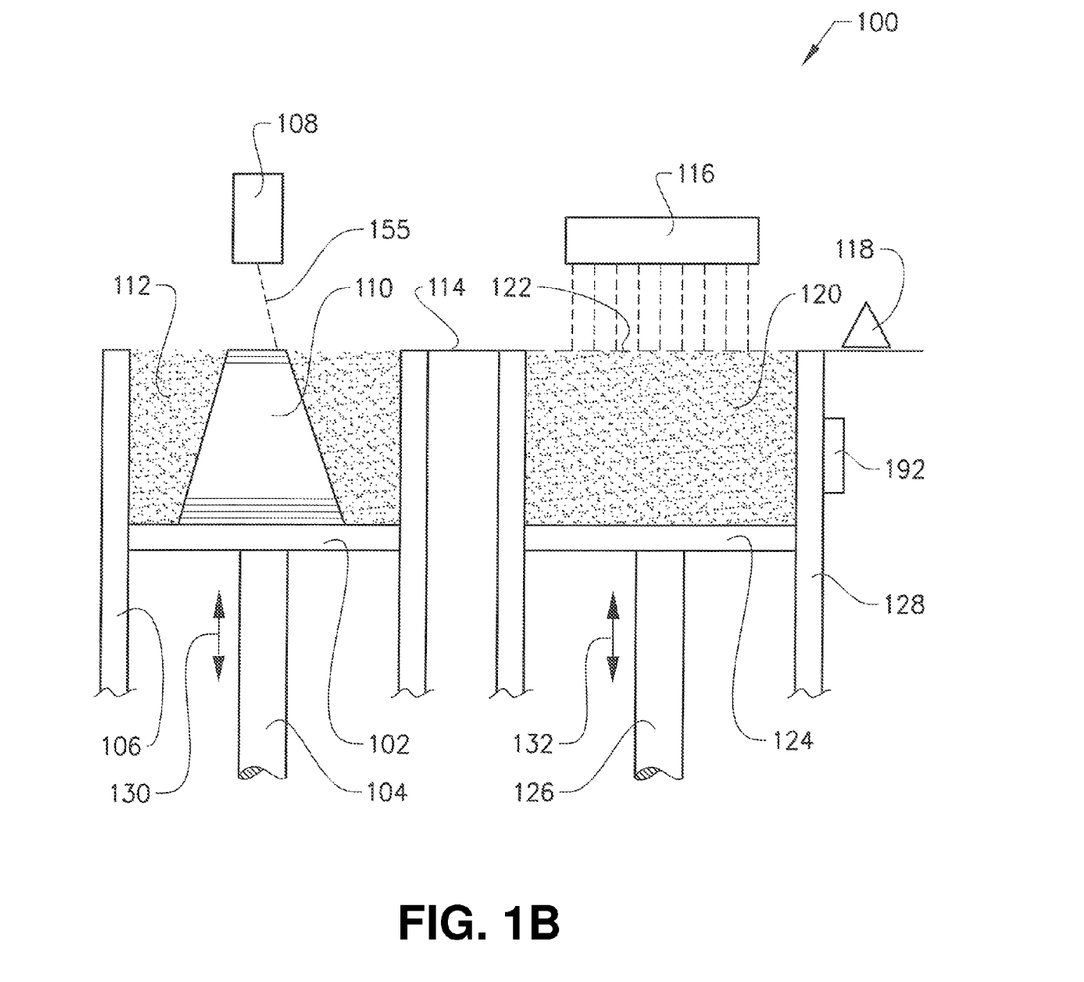
FIG. 1B depicts, in a schematic view, a first embodiment of a device according to the present invention for coating powder for use in an additive manufacturing process.

The coating may be provided prior to providing the powder particles on the work table 102. FIG. 1B depicts an example embodiment of a method for coating powder particles prior to providing the powder particles on the work table 102.

In FIG. 1B the coating of powder may be performed on a top surface of the powder in a powder container 128. The coating may be applied on the powder particles via a coating device 116. The coating on the powder particles may be provided by at least one of the group of: sputtering, chemical vapor deposition, physical vapor deposition, laser ablation, resistive melting of a target, laser beam melting of a target and/or electron beam melting of a target. The electron beam or laser beam used for melting the target may be the same electron beam or laser beam which is used for fusing the powder layers.

In an example embodiment of the present invention a vibrating device 192 may be provided on the powder container 128. The vibrating device may introduce vibrating power on the powder in the powder container. This may cause the powder particles to move around on the top surface of the powder in the powder container 128, allowing for a coating on all surface positions of the powder particles in the top surface layer of the powder in the powder container 128.

When the top surface of the powder 120 in the powder container 128 has been coated a movable floor 124 may be moved upwards by suitable means attached to a piston 126 which in turn is attached to the movable floor 124. The means for moving the movable floor may be an electric motor, a pneumatic motor, a hydraulic motor etc. The movable floor may be increased a certain distance allowing the powder distributor 118 to rake off a predetermined amount of material from the powder container 128 and distribute the powder evenly on top of the work table 102 in the build tank 106. When moving the powder particles from the powder container, the coated powder particles may be mixed with the non-coated powder particles. When distributing a powder layer on top of the work table 102, the powder which is distributed may be an evenly distributed mix of coated and non-coated powder particles allowing for a good control of the material properties when the powder particles is fused.

The powder rake 118 may remove a predetermined thickness of the powder material from a powder tank 128 to the build tank 106. In an example embodiment the rake removes the same thickness as the distance in which the movable floor 124 in the powder tank 128 is raised. In another embodiment a fraction of the powder thickness, corresponding to a fraction of a height in which the movable floor 124 is raised, is removed and transferred from the powder tank 128 to the build tank 106. The powder tank 128 in FIG. 1B is very similar to the build tank 106. The powder tank 128 comprises a movable bottom plate 124, which may change its position in the same way as the work table 102 in the build tank 106. In FIG. 1B it is only illustrated one powder tank 128 to the right of the build tank 106. In an another embodiment there may be provided another powder tank 128 to the left of the build tank 106.

A first type of powder material may be provided in a first powder tank and a second powder material may be provided in a second powder tank. A first coating device may be coating the top surface of the powder in the first powder tank. A second coating device may be coating the top surface of the powder in the second powder tank. The coating material in the first coating device may be different to the coating material in the second coating device. The coating material in the first coating device may be equal to the coating material in the second coating device.

In an example embodiment the coating on the powder particles may be made of the same material as the powder particles itself. For instance, if the powder particles are made of titanium, the coating may be made of titanium.

In another example embodiment the coating may be made of another material compared to the powder particles. For instance, if the powder particles are made of a ceramic material the coating may be made of metal, for instance copper.

In still another example embodiment the coating may have at least one material component in common with the powder particles. For instance, if the powder particles are made of TiAl, the coating may be made of titanium or aluminum.

In yet another example embodiment the coating may have no material component in common with the powder particles. If the powder particles are made of Ti, the coating may be made of Al.

The material characteristics may be altered for at least one layer of the three-dimensional article by providing a predetermined thickness of the coating on a predetermined portion of the powder particles. For example, if the powder particles are made of Ti, the coating may be made of Al. The coating may be applied for every second layer, thereby forming a sandwiched structure of the material having different properties for different layers. Instead of applying the coating on the powder particles layer wise, the coating may be applied for different parts of the three dimensional structure to be manufactured, i.e., a first portion may have the material of the powder particles only and a second portion may have the alloy of the powder particle material and the coating material. This means that three-dimensional articles may be manufactured, which have different material characteristics for different portions of the finalized article, although the same powder particles are used throughout the manufacturing process. The application of the coating of the powder particles allows for customized and/or fine-tuned material properties of the three dimensional articles produced with additive manufacturing.

In still another example embodiment of the present invention, the powder particles may be made of polymer material or ceramic material and the coating may be made of electrically conductive material, for instance metal. The coating material may also be made of carbon. This allows for manufacturing three dimensional articles made essentially of electrically insulating material such as polymer or ceramic material by using an electron beam. Without the electrically conductive coating, which makes the electrically isolating powder particles electrically conductive, the electron beam is not suitable for manufacturing three dimensional articles using powder material which have little or no electric conductivity. By applying a thin coating of a material which is electrically conductive, an electron beam may be used for additively manufacturing a three dimensional article by using powder material which is more or less regarded as electrically isolating.

In an example embodiment the coating material may have an electrical conductivity which is higher than the powder particles.

In another embodiment the coating may be provided prior to providing the powder particles in the additive manufacturing machine. The powder coating device may in this embodiment be separated from the additive manufacturing machine.

Figure 2:
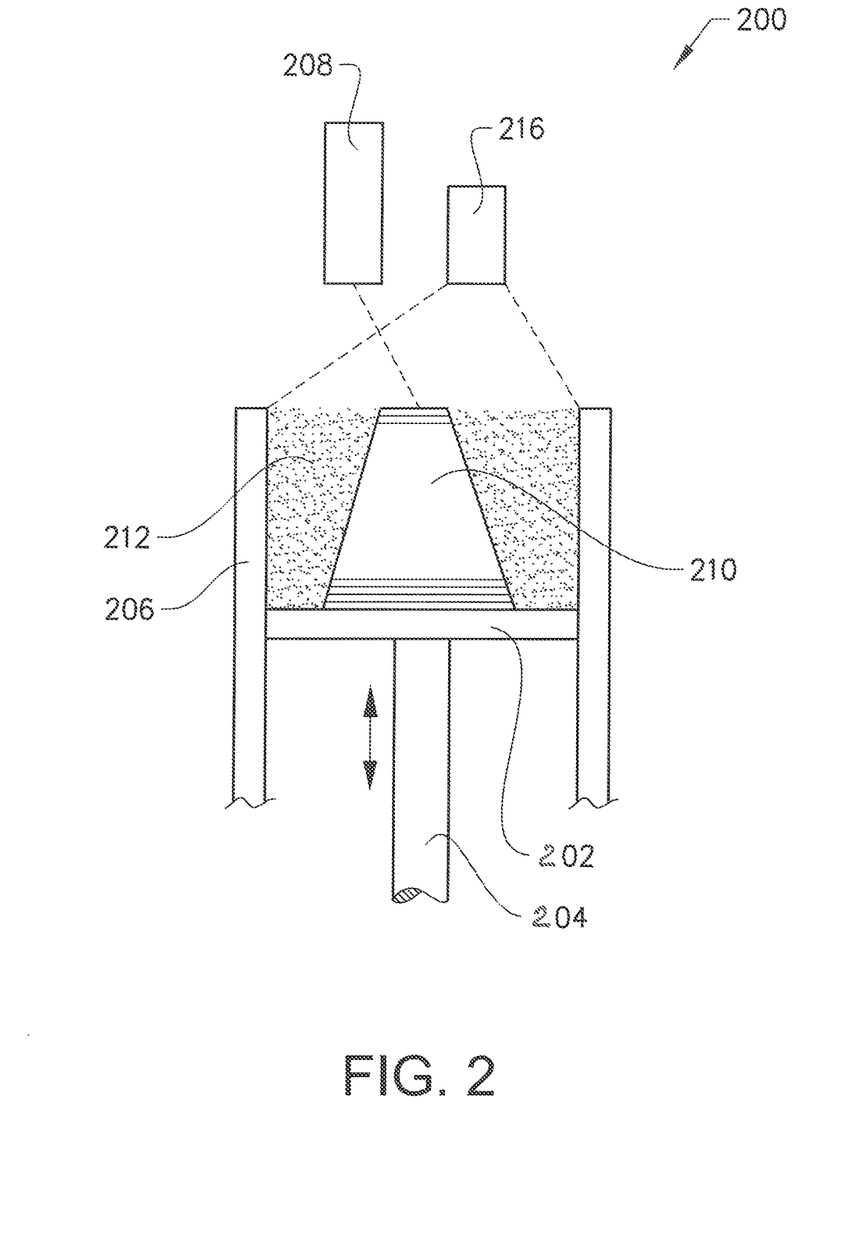
FIG. 2 depicts, in a schematic view, a second embodiment of a device according to the present invention for coating powder for use in an additive manufacturing process.

In another example embodiment the coating may be provided on the powder particles while the powder particles are provided on the work table 202, see FIG. 2. In FIG. 2 an energy beam source 208, which may be a laser source or an electron beam source, may be used for fusing powder layers provided on a worktable at selected locations according to a model. A coating device 216 may be used for coating one or several layers of the powder material 212 which is to be fused. The coating process may be performed in between the powder distribution process and the fusing process, i.e., as soon as a powder layer has been provide on the work table 202 the coating device 216 may start to coat the top surface layer of the powder in the build tank 206. A shutter (not illustrated) may be provided in between the coating device and the top surface of the powder on the work table. The shutter may determine which region of the top surface of the powder on the work table to coat.

In an example embodiment the coating device may be provided movable in a vertical direction and/or a horizontal direction. By moving the coating device 216, the coating device may cover different areas of the powder surface. The coating device may scan the complete top surface of the powder on the work table for coating powder particles on each and every position of the top surface. Varying the height, i.e., moving the coating device in a vertical direction may also influence the covering area of the coating device, a larger distance from the coating device to the top surface of the powder on the work table may cover a larger area compared to if the coating device is provided closer to the top surface of the powder on the work table.

The work table and/or the build tank may be provided with a vibrator which is activated while coating the powder on the work table.

The present invention also relates to an apparatus for forming a three-dimensional article through successive fusion of parts of at least one layer of a powder bed provided on a work table, which parts corresponds to successive cross sections of the three-dimensional article. The apparatus comprises an energy beam source for fusing the powder, a powder distributor for distributing the powder on top of the work table, and a coating device for coating at least a portion of the powder with a coating material.

The energy beam source may be a laser beam source or an electron beam source. The powder distributor may be a rake arranged at a predetermined distance above the top surface of the work table or the top surface of the previous powder layer provided on the work table. Powder material may be provided in front of the rake. The rake may have a length which is longer than the width of the work table. The rake is movable horizontally at a predetermined distance above the top surface of the work table or the top surface of the previous powder layer provided on the work table. Powder material provided in front of the rake is evenly distributed on the work table or the previous powder layer on the work table.

The coating device may be a sputtering device, chemical vapor deposition device, physical vapor deposition device, laser ablation device, a device for resistive melting of a target, a device for laser beam melting of a target and/or a device for electron beam melting of a target.

The coating device may be arranged in the apparatus for coating the powder particles before being provided on the work table. An example embodiment of this situation is illustrated in FIG. 1B.

The coating device may be arranged in the apparatus for coating the powder while being arranged on the work table. An example embodiment of this situation is shown in FIG. 2.

Figure 3:
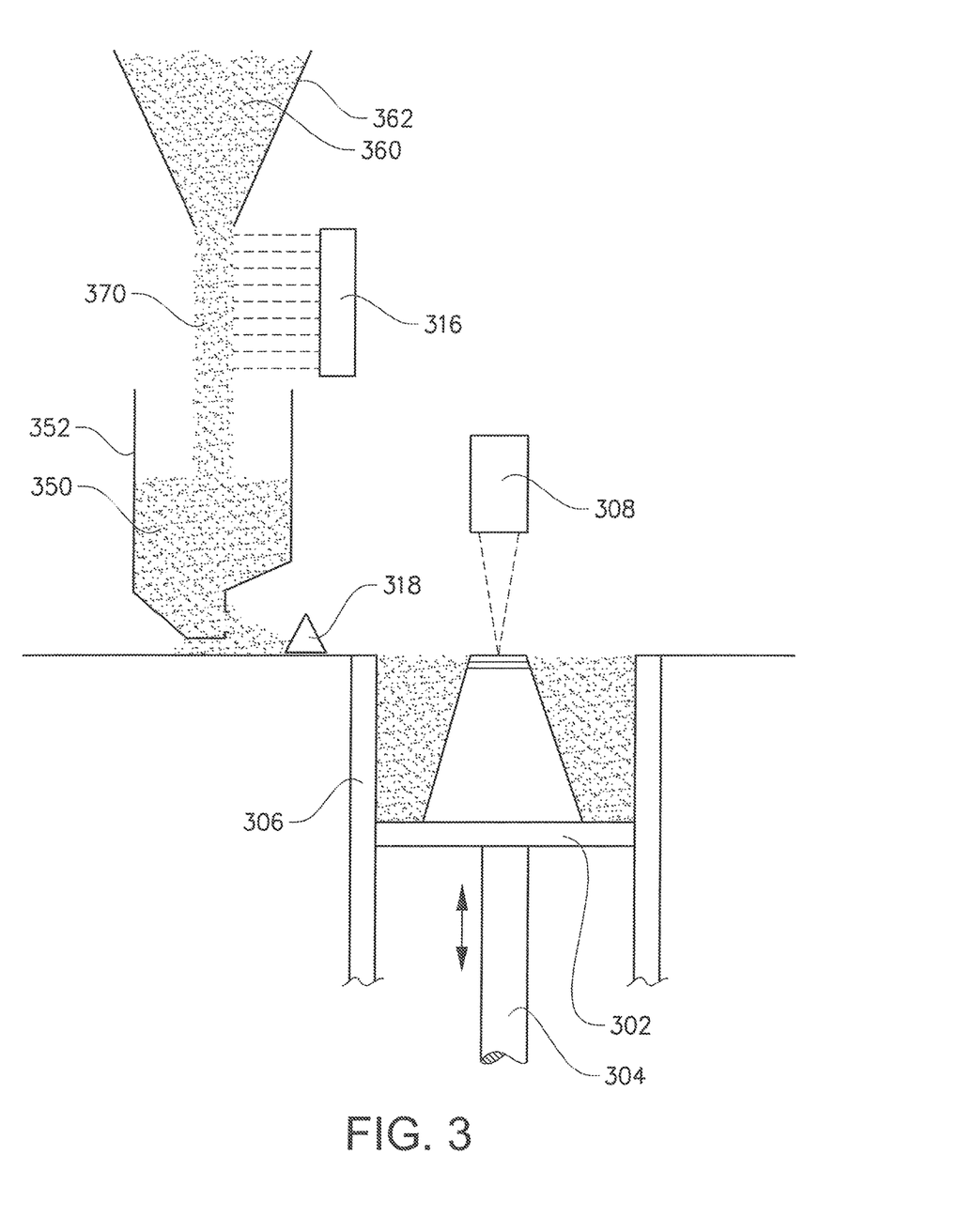
FIG. 3 depicts, in a schematic view, a third embodiment of a device according to the present invention for coating powder for use in an additive manufacturing process.

The coating device may be arranged in the apparatus for coating free-floating powder. An example embodiment of this situation is shown in FIG. 3. Powder particles 360 may be provided in an external container 362. The powder particles 360 in the external container 362 may be transferred from the external container 362 to a powder hopper 352. Freely falling powder 370 from the external container 362 to the powder tank 352 may be coated with a coating device 316. Coated powder particles 350 are filling the powder tank 352.

The coated powder particles may be used in an additive manufacturing process. An schematic illustration of an example embodiment of an additive manufacturing device is illustrated to the right of the powder tank 352. A powder distributor 318 may catch coated powder material 350 from the scree of powder falling out of the powder tank 352 by moving the powder distributor 318 a predetermined distance into the scree of powder. The powder caught by the powder distributor is distributed over the work table 302. A thickness of a powder layer to be fused may be determined by the distance which the work table 302 has been lowered in relation to the previous layer. An energy beam source 308 may melt the powder layer in selected locations according to a model.

The powder which may be raked from the powder tank 352 to the build tank is distributed evenly on top of the work table inside the build tank. The evenly distribution may be performed with the powder rake 318, but may also be performed with another distribution device such as another rake or a vibration or oscillation mechanism.

A first layer of the three-dimensional article may be formed by fusing the layer of powder provided on the work table in predetermined locations.

The work table 302 may be lowered a predetermined distance in order to allow a further layer of powder material to be provided on the already applied powder layers on the work table. The steps of raking new powder material from the powder hopper to the build tank, distribution of the powder on the work table, fusing of the powder layers on predetermined location and lowering of the work table is repeated until the three dimensional article is finalized.

It should be understood that the present invention is not limited to the above-described embodiments and many modifications are possible within the scope of the following claims. Such modifications may, for example, involve using a different source of energy beam than the exemplified electron beam such as a laser beam. Additionally or otherwise, materials other than metallic powder may be used, such as the non-limiting examples of powder of polymers or powder of ceramics.

That which is claimed:

1. A method for forming a three-dimensional article through successive fusion of parts of at least one layer of a powder bed provided on a work table in a vacuum chamber, which parts corresponds to successive cross sections of the three-dimensional article, said method comprising the steps of:
    applying a layer of predetermined thickness of powder particles on said work table in said vacuum chamber;
    applying a coating material on at least a portion of said layer of said powder particles while said powder particles are inside said vacuum chamber, wherein said coating material (a) is at least partially covering said powder particles, and (b) has an electrical conductivity higher than an electrical conductivity of the powder particles, said higher electrical conductivity of said coating material being configured for increasing the electrical conductivity of the powder; and
    fusing said powder particles on said work table with an energy beam.

2. The method according to claim 1, wherein said coating material is applied on said powder particles while said pressure in said vacuum chamber is less than $1 \times 10^{-2}$ mbar.

3. The method according to claim 1, further comprising vibrating the work table while at least one of applying said coating material on said powder particles or while said powder particles are on said work table.

4. The method according to claim 1, wherein said coating material is applied by a process selected from the group consisting of: sputtering, chemical vapor deposition, physical vapor deposition, laser ablation, resistive melting of a target, laser beam melting of a target, electron beam melting of a target, and any combination thereof.

5. The method according to claim 1, wherein said coating material is made of the same material as the powder particles.

6. The method according to claim 1, wherein said coating material is made of a material different from a material from which the powder particles are made.

7. The method according to claim 6, wherein said coating material has at least one material characteristic in common with the material of the powder particles.

8. The method according to claim 6, wherein said coating material has no material characteristics in common with the material of the powder particles.

9. The method according to claim 1, further comprising changing the material characteristics for at least one layer of the three-dimensional article by providing a predetermined thickness of said coating material on a predetermined portion of said powder particles.

10. The method according to claim 1, wherein:
    said powder particles are made of at least one of a ceramic material or a polymer material; and
    said coating material is made of an electrically conductive material.

11. The method according to claim 1, wherein said energy beam is at least one of an electron beam or a laser beam.

* * * * *